US006239614B1

United States Patent
Morikawa

(10) Patent No.: US 6,239,614 B1
(45) Date of Patent: May 29, 2001

(54) SEMICONDUCTOR INTEGRATED CIRCUIT DEVICE

(75) Inventor: Koichi Morikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/283,179

(22) Filed: Apr. 1, 1999

(30) Foreign Application Priority Data

Jan. 14, 1999 (JP) .................................................. 11-008116

(51) Int. Cl.[7] ........................................................ G06F 7/38

(52) U.S. Cl. ................................ 326/39; 326/39; 326/40; 257/206; 257/207

(58) Field of Search .................................. 326/39, 38, 40, 326/41, 37; 257/206, 207, 204, 392

(56) References Cited

U.S. PATENT DOCUMENTS

| | | | |
|---|---|---|---|
| 5,552,618 | * | 9/1996 | Taniguchi et al. .................... 257/207 |
| 5,932,900 | * | 8/1999 | Lin et al. ............................... 257/204 |
| 5,945,702 | * | 8/1999 | Nakanishi ............................ 257/296 |
| 5,994,726 | * | 11/1999 | Ikeda et al. ........................... 257/207 |
| 6,040,609 | * | 3/2000 | Frisina ................................. 257/391 |
| 6,066,866 | * | 5/2000 | Omori .................................. 257/202 |

OTHER PUBLICATIONS

Shin'ichiro Mutoh et al., "1–V Power Supply High–Speed Digital Circuit Technology with Multithreshold–Voltage CMOS" IEEE Journal of Solid–State Circuits, vol. 30, No. 8, Aug. 1995, pp. 846–854.

* cited by examiner

Primary Examiner—Michael Tokar
Assistant Examiner—Vibol Tan
(74) Attorney, Agent, or Firm—Jones Volentine, LLC

(57) ABSTRACT

The present invention comprises first unit cells each including PMOS transistors and NMOS transistors, each transistor having a first threshold voltage, second unit cells each including PMOS transistors and NMOS transistors, each transistor having a second threshold voltage, a unit cell array comprised of the first and second unit cells laid in array form, a power switch disposed around the unit cell array and comprised of the PMOS transistors and NMOS transistors each having the second threshold voltage, and input/output circuits disposed around the unit cell array. Another invention comprises a first power supply line supplied with a first power supply potential level, a second power supply line supplied with a second power supply potential level, a first virtual power supply line, a second virtual power supply line, a latch circuit electrically connected between the first and second power supply lines, at least one logic circuit electrically connected between the first and second virtual power supply lines, a first capacitor electrically connected between the first power supply line and the first virtual power supply line, and a second capacitor electrically connected between the second power supply line and the second virtual power supply line.

7 Claims, 6 Drawing Sheets

SEMICONDUCTOR INTEGRATED CIRCUIT DEVICE

BACKGROUND OF THE INVENTION

Field of the Invention

This invention relates to a semiconductor integrated circuit device, and particularly to a semiconductor integrated circuit device including MOS transistors, which is capable of operating at a low power supply voltage when taken active and reducing power consumption resultant from a leakage current during standby.

Description of the Related Art

As high integration of an LSI or an increase in performance thereof progresses, how to reduce the power consumption has recently been recognized as an important problem. It can be said that in a CMOS type LSI in particular, a reduction in the power supply voltage is a method most effective for low power consumption because the power consumption is directly proportional to the square of the power supply voltage. However, the reduction in the power supply voltage will cause a reduction in the operating speed of a MOS transistor. Avoiding this needs to reduce a threshold voltage when it is active. However, the reduction in the threshold voltage leads to an increase in leakage current of the MOS transistor during standby. An MTCMOS (Multithreshold-Voltage CMOS) has been proposed as an LSI for solving such a problem. The MTCMOS has been introduced in the paper: [1-V Power Supply High-Speed Digital Circuit Technology with Multithreshold-Voltage CMOS (IEEE JOURNAL OF SOLID-STATE CIRCUIT. VOL. 30. NO. 8, AUGUST 1995 ) or the like, for example.

This type of MTCMOS generally has at least one logic circuit electrically connected between a virtual power supply line and a virtual power supply line and comprised of MOS transistors each having a low threshold voltage and standby power control MOS transistors each having a high threshold voltage, which are electrically connected between a power supply line and the virtual power supply line and between a ground line and a virtual ground line to reduce the leakage current of each MOS transistor during standby. Further, MTCMOS has a latch circuit directly connected between the-power supply line and the ground line. Since the latch circuit is provided with MOS transistors each having a high threshold voltage, which are directly connected to the power supply line and the ground line, it is possible to prevent the destruction of data stored in the logic circuit even if the virtual power supply line and the virtual ground line are respectively brought to a floating state during standby.

However, the conventional MTCMOS adopts a standard cell system in which layout design is performed in units of a latch circuit such as a flip-flop circuit comprised of an inverter circuit, a master circuit and a slave circuit, and a logic circuit. The layout design based on such a standard cell system has a problem in that since it is performed in respective circuit units, the period required to manufacture the MTCMOS becomes long.

In the conventional MTCMOS on the other hand, the threshold voltage of the standby power control MOS transistor used to reduce the leakage current flowing during standby is set sufficiently high. Thus, when it is taken active, a sufficient current is not supplied to the virtual power supply line or the virtual ground line thereby to make the voltage value unstable. As a result, the conventional MTCMOS has inconvenience that a high-speed logical operation cannot be implemented.

SUMMARY OF THE INVENTION

With the foregoing in view, it is therefore an object of the present invention to implement the layout of a semiconductor integrated circuit device by a gate array system, thereby shortening a manufacturing period thereof as compared with the conventional standard cell system. It is another object of the present invention to provide a semiconductor integrated circuit device capable of restraining variations in the values of voltages applied to a virtual power supply line and a virtual ground line and reducing a delay time when switching is done between logic circuits provided within an MTCMOS.

According to one aspect of this invention, for achieving the above objects, there is provided a semiconductor integrated circuit device comprises first unit cells each including PMOS transistors and NMOS transistors, each transistor having a first threshold voltage, second unit cells each including PMOS transistors and NMOS transistors, each transistor having a second threshold voltage, a unit cell array comprised of the first and second unit cells laid in array form, a power switch disposed around the unit cell array and comprised of the PMOS transistors and NMOS transistors each having the second threshold voltage, and input/output circuits disposed around the unit cell array. Another invention comprises a first power supply line supplied with a first power supply potential level, a second power supply line supplied with a second power supply potential level, a first virtual power supply line, a second virtual power supply line, a latch circuit electrically connected between the first and second power supply lines, at least one logic circuit electrically connected between the first and second virtual power supply lines, a first capacitor electrically connected between the first power supply line and the second virtual power supply line, and a second capacitor electrically connected between the second power supply line and the first virtual power supply line.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings.

First Embodiment

Figure 1:
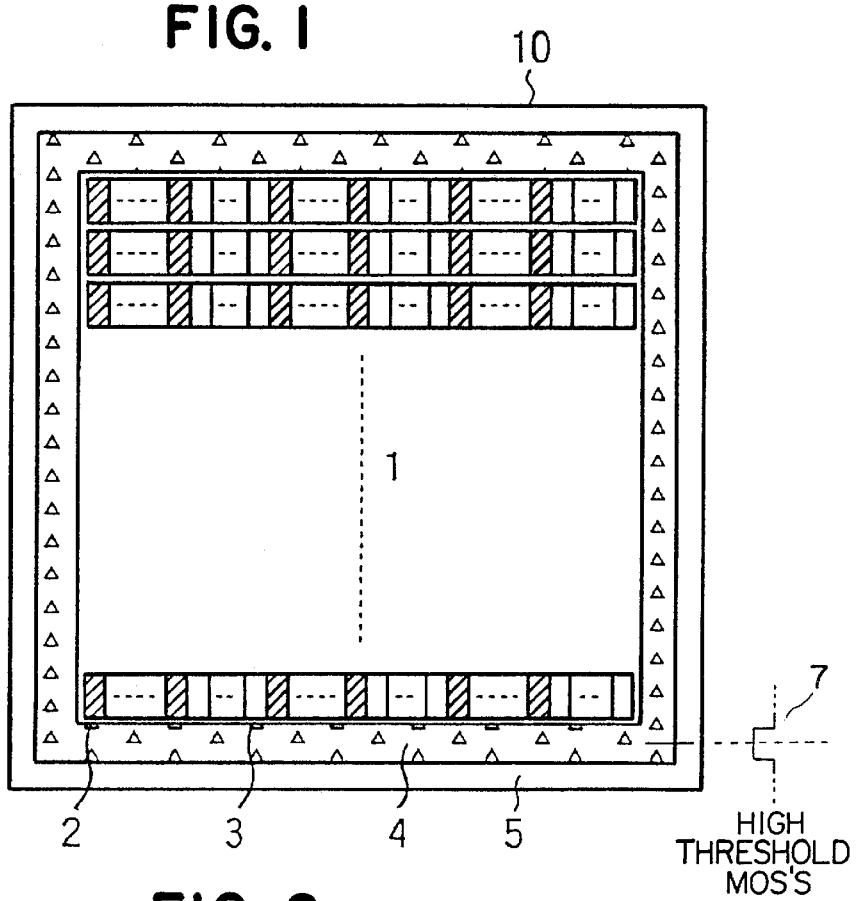
FIG. 1 is a layout showing a first embodiment of the present invention.
Figure 3:
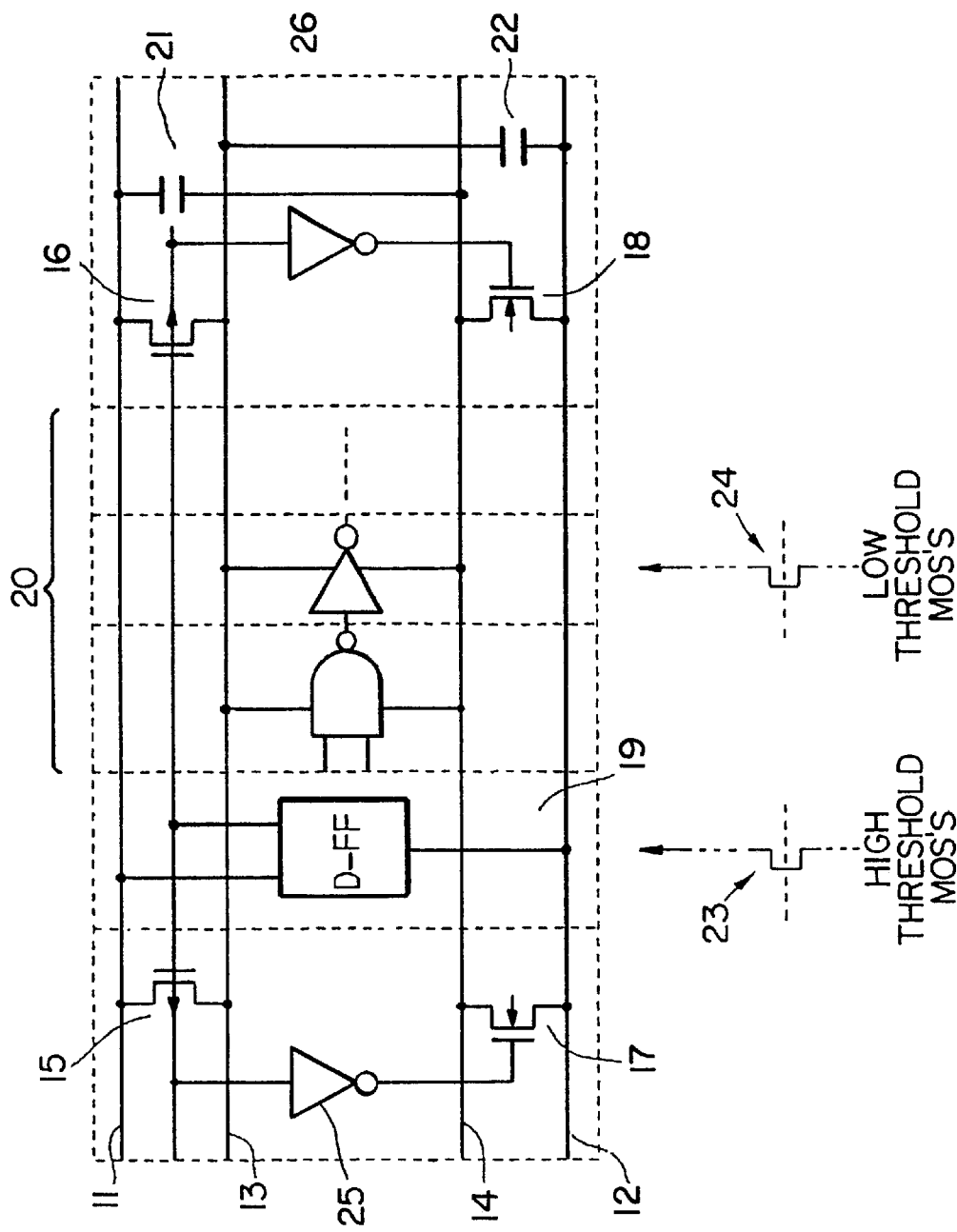
FIG. 3 is a circuit diagram depicting one example of a configuration of a semiconductor integrated circuit device of the present invention.

FIG. 1 is a layout showing a first embodiment of the present invention. FIG. 3 is a circuit diagram illustrating one example of the unit cells shown in FIG. 1 according to a configuration of a semiconductor integrated circuit device of the present invention. The semiconductor integrated circuit device (hereinafter called "MTCMOS") 10 comprises unit cells 2 each comprised of PMOS and NMOS transistors both having a low threshold voltage, unit cells 3 each comprised of PMOS and NMOS transistors both having a high threshold voltage, a unit cell array 1 in which the unit cells 2 and 3 are laid in array form, a power switch 4 placed around the unit cell array 1, and input/output circuits 5 disposed therearound. The power switch 4 comprises a PMOS transistor and an NMOS transistor each of which is a MOS transistor 7 for cutting off a leakage current during standby and has a high threshold voltage.

A latch circuit 19 directly connected between a power supply line 11 and a ground line 12 comprises the MOS transistors 23 each having the high threshold voltage, lying within each unit cell 3. The latch circuit 19 prevents the destruction of data during standby owing to the formation of a latch path between the power supply line 11 and the ground line 12. On the other hand, a set or arrangement of various logic circuits 20 electrically connected between a virtual power supply line 13 and a virtual ground line 14 is comprised of the MOS transistors 24 each having the low threshold voltage, lying within each unit cell 2. As a result, the logic circuits 20 can be activated at a low power supply voltage (about 1V) when taken active.

Further, the circuit of FIG. 3 includes a capacitor 21 connected between power supply line 11 and virtual ground line 14, a capacitor 22 connected between virtual power supply line 13 and ground line 12, transistors 15 and 16 connected across power supply line 11 and virtual power supply line 13, and transistors 17 and 18 connected across virtual ground line 14 and ground line 12. Further, an inverter 25 connects the substrate of transistor 15 to the gate of transistor 17, and an inverter 26 connects the substrate of transistor 18 to the gate of transistor 16.

The ratio of the unit cells 2 to the unit cells 3 in the unit cell array is suitably selected according to the required number of latch circuits and logic circuits in an application LSI to be manufactured, while taking into consideration the number of cells used in a wiring area.

Since the layout of the MTCMOS 10 can be implemented in accordance with a gate array system in the present embodiment, a manufacturing period can be shortened as compared with the conventional standard cell system.

Figure 2:
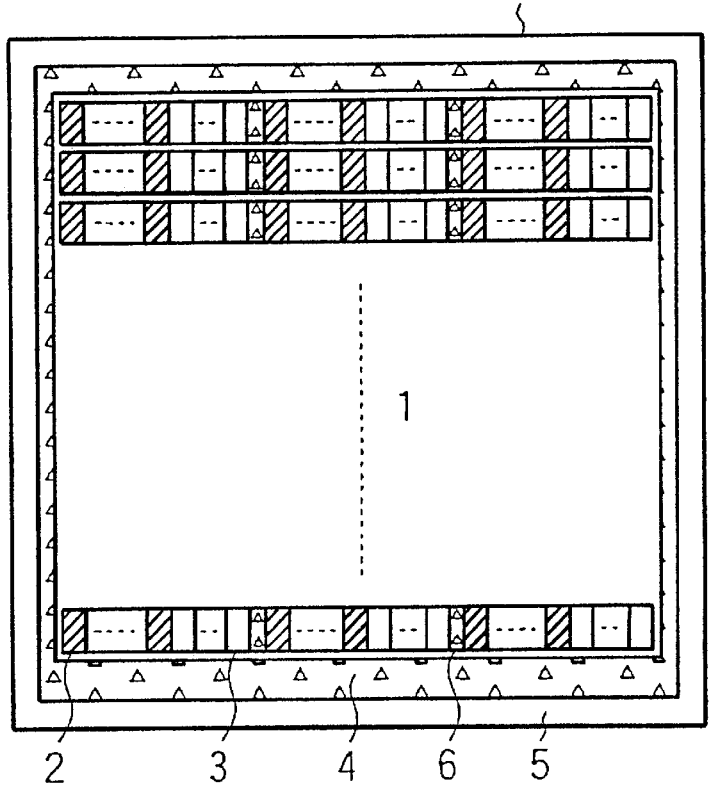
FIG. 2 is a layout illustrating another example of the first embodiment of the present invention.

FIG. 2 is a layout showing another example of the first embodiment of the present invention. The present example is different from the first embodiment in that parts 6 of a power switch comprised of MOS transistors each having a high threshold voltage are placed within a unit cell array 1. In an MTCMOS 10 constructed using the unit cell array 1 shown in FIG. 2, a virtual power supply line 13 and a virtual ground line 14 are reduced in resistive component. Further, variations in the values of voltages applied to the virtual power supply line 13 and virtual ground line 14 at the switching between the set of logic circuits 20 become small. As a result, a delay time produced in each logic circuit 20 can be restrained from increasing.

Figure 4:
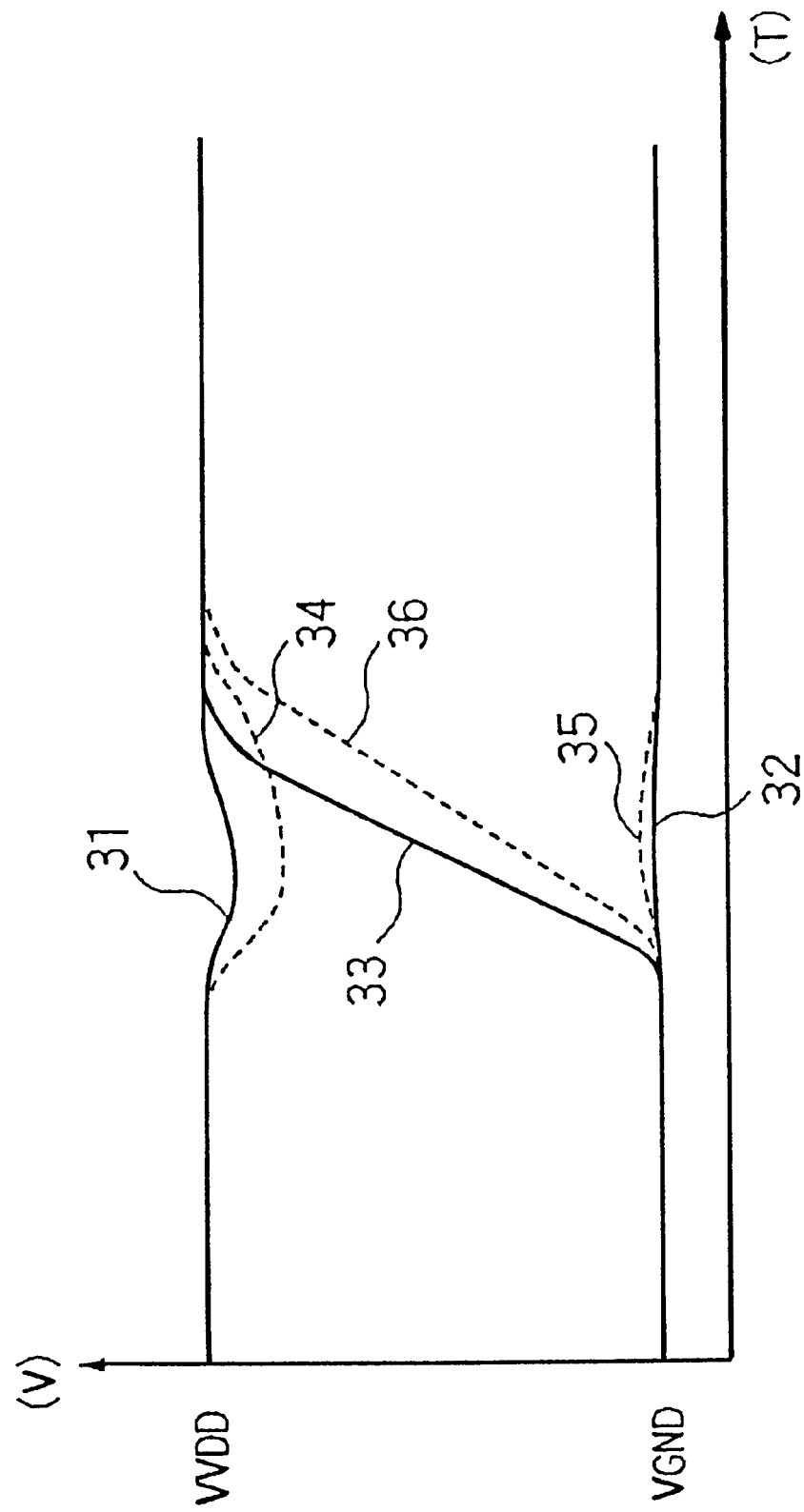
FIG. 4 is a waveform chart for describing the operations of the first embodiment of the present invention and another example thereof.

FIG. 4 is a waveform chart for describing the operations of the first embodiment of the present invention and another example thereof. In the waveform chart shown in FIG. 4, the vertical axis thereof indicates a voltage value (V) and the horizontal axis thereof indicates the time (T), respectively. Respective output waveforms of the MTCMOS 10 constructed using the unit cell array 1 shown in FIG. 1 are respectively represented by dotted lines, whereas respective output waveforms of the MTCMOS 10 constructed using the unit cell array 1 shown in FIG. 2 are respectively represented by solid lines. Described specifically, they include output waveforms 31 and 34 which appear on the virtual power supply line, output waveforms 32 and 35 which appear on the virtual ground line, and output waveforms 33 and 36 produced from the set of logic circuits. It is understood that if the respective output waveforms 31 and 32 indicated by the solid lines, which appear on the virtual power supply and ground lines are respectively compared with the respective output waveforms 34 and 35 indicated by the dotted lines, which appear on the virtual power supply and ground lines, then variations in voltage values are reduced (the voltage values are stable). It is also understood that if a comparison is made between the output waveform 33 indicated by the solid line, which is produced from the logic circuit arrangement and the output waveform 36 indicated by the dotted line, which is produced from the logic circuit arrangement, then the output of the logic circuit arrangement is made steep and hence the logic circuit arrangement 20 is reduced in delay time.

In another example of the present embodiment, the parts 6 of the power switch comprised of the MOS transistors each having the high threshold value are placed within the unit cell array 1. Thus, when switching is done between the logic circuits placed within the MTCMOS constructed using such a unit cell array, it is possible to control or restrain variations in the voltage values on the virtual power supply and ground lines and reduce the delay time.

Second Embodiment

Figure 5:
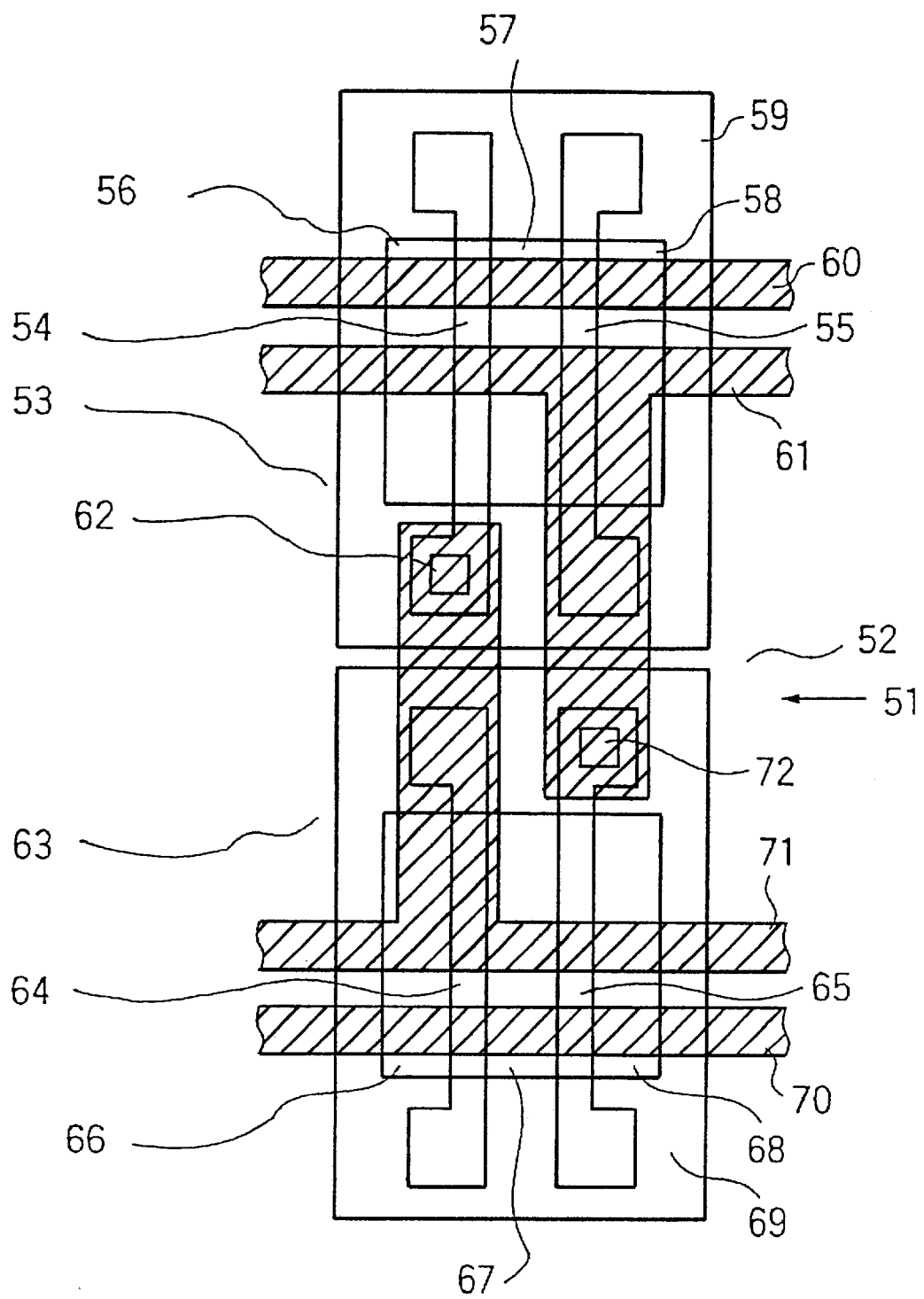
FIG. 5 is a layout showing a second embodiment of the present invention.

A second embodiment is equivalent to one related to a pattern layout of capacitors 21 and 22 illustrated in the semiconductor integrated circuit device shown in FIG. 3. FIG. 5 is a layout showing the second embodiment of the present invention. A unit cell 51 is one which is not used for a circuit configuration of MTCMOS upon wire processing of MTCMOS. The unit cell 51 comprises two PMOS transistors 53 each comprised of an N well 59, P-type diffused layers 56, 57 and 58, and gate electrodes 54 and 55 all of which are formed on a substrate 52, and two NMOS transistors 63 each comprised of a P well 69, N-type diffused layers 66, 67 and 68, and-gate electrodes 64 and 65 all of which are formed on the substrate 52. The gate electrode 54 of each PMOS transistor 53 is electrically connected to a virtual ground line 71 by a contact 62. The gate electrode 65 of each NMOS transistor 63 is electrically connected to a virtual power supply line 61 by a contact 72. Incidentally, the N well 59 is fixed to a power supply potential level and the P well 69 is fixed to a ground potential level, respectively.

Since gate capacitance having a MOS capacitor structure, which is formed between the gate electrode 54 an the N well 59, is activated as de-coupling capacitance (corresponding to the capacitor 21) because the gate electrode 54 of the PMOS transistor 53 is electrically connected to the virtual ground line 71, the value of a voltage applied on the virtual ground line is stabilized. Similarly, since gate capacitance formed between the gate electrode 65 and the P well 69,is activated as de-coupling capacitance (corresponding to the capacitor 22) because the gate electrode 65 of the NMOS transistor 63 is electrically connected to the virtual power supply line 61, the value of a voltage applied to the virtual power supply line is stabilized. Owing to the provision of such capacitors 21 and 22, when switching is done between logic circuits provided within MTCMOS, the values of the voltages applied to the virtual power supply and ground lines can be restrained from varying and the delay time can be reduced.

Figure 6:
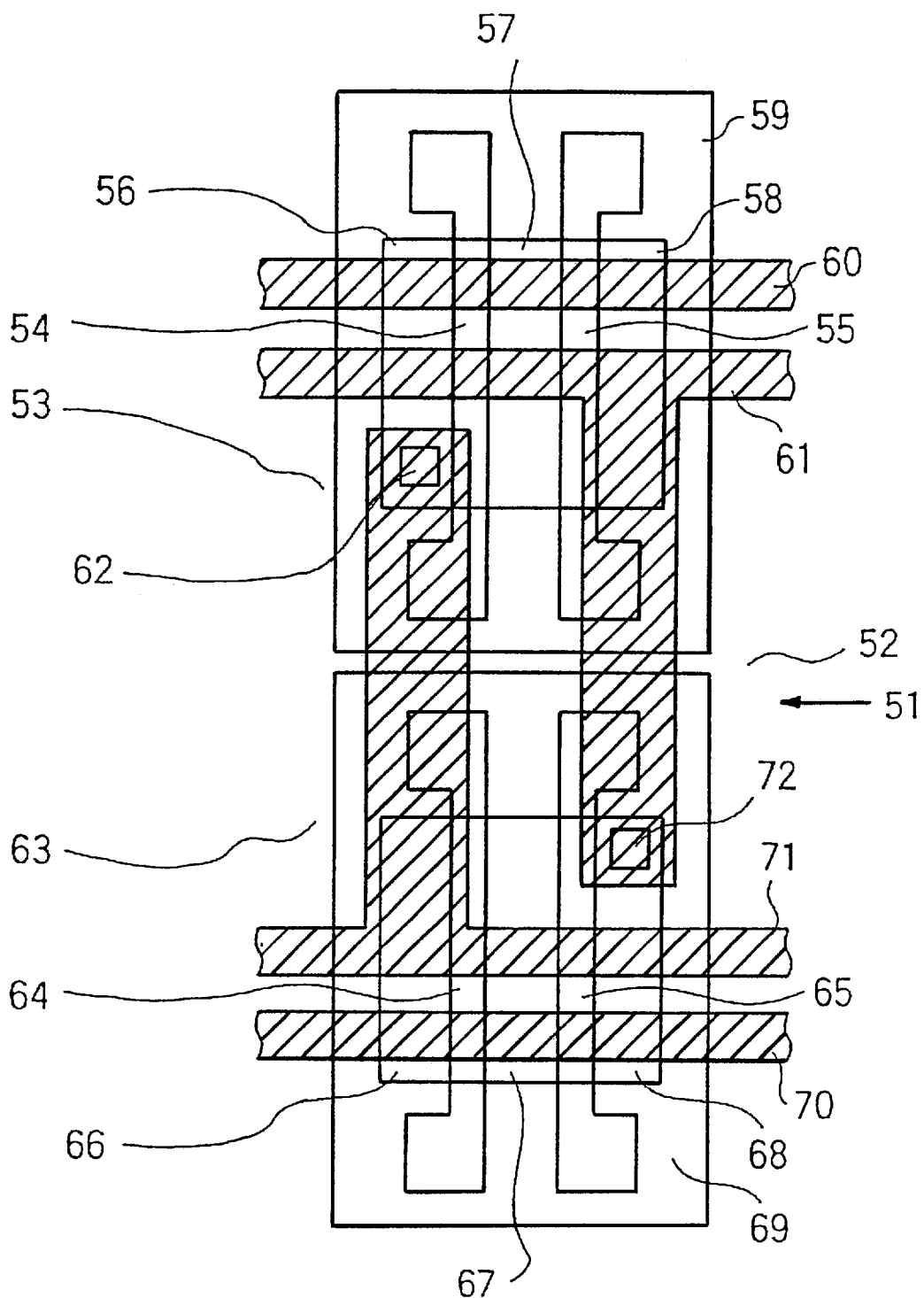
FIG. 6 is a layout illustrating another example of the second embodiment of the present invention.

Another example of the second embodiment will next be explained. FIG. 6 is a layout showing another example of the second embodiment of the present invention. Incidentally, the same elements of structure as those shown in FIG. 5 are identified by like reference numerals and the description of certain common elements will be omitted. A unit cell 51 is equivalent to a unit cell not used for a circuit configuration of MTCMOS upon wire processing of MTCMOS. The unit cell 51 comprises a PMOS transistor 53 and an NMOS transistor 63. A P-type diffused layer 56 of the PMOS transistor 53 is electrically connected to a virtual ground line 71 by a contact 62. An N-type diffused layer 68 of the NMOS transistor 63 is electrically connected to a virtual power supply line 61 by a contact 72. Incidentally, an N well 59 is fixed to a power supply potential level and a P well 69 is fixed to a ground potential level, respectively.

Since the P-type diffused layer 56 of the PMOS transistor 53 is electrically connected to the virtual ground line 71, PN-junction capacitance formed between the P-type diffused layer 56 and the N well 59 electrically connected to the ground potential is activated as de-coupling capacitance (corresponding to a capacitor 21). Therefore, the value of a voltage applied to the virtual ground line is stabilized. Similarly, since the N-type diffused layer 68 of the NMOS transistor 63 is electrically connected to the virtual power supply line 61, PN-junction capacitance formed between the N-type diffused layer 68 and the P well 69 electrically connected to the power supply potential is activated as de-coupling capacitance (corresponding to a capacitor 22). Therefore, the value of a voltage applied to the virtual power supply line is stabilized. Owing to the provision of such capacitors 21 and 22, when switching is done between logic circuits placed within MTCMOS, the values of the voltages applied to the virtual power supply and ground lines can be restrained from varying and the delay time can be reduced.

Third Embodiment

Figure 7:
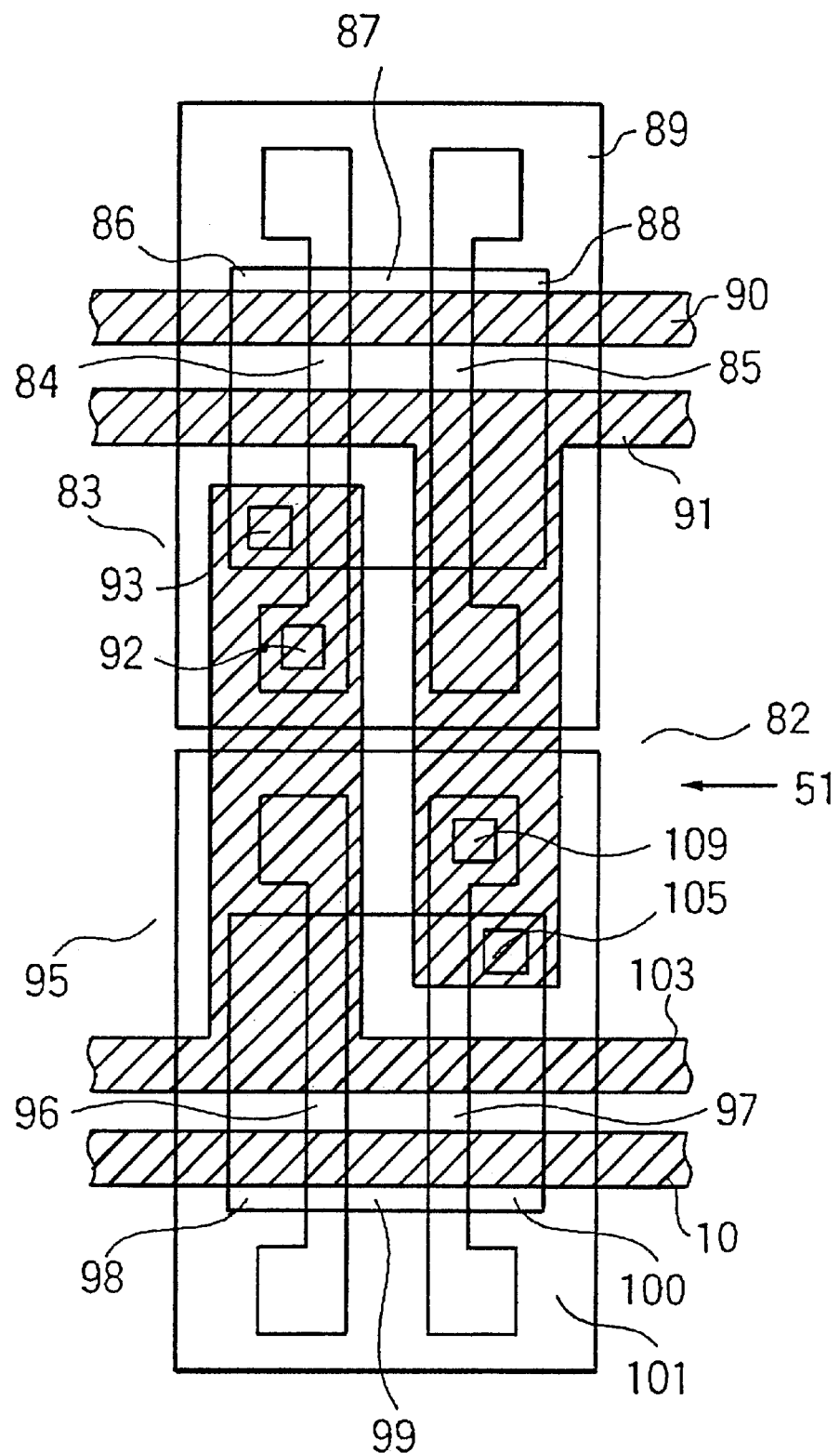
FIG. 7 is a layout depicting a third embodiment of the present invention.

Similar to the second embodiment, a third embodiment is equivalent to one related to a pattern layout of the capacitors 21 and 22 illustrated in the semiconductor integrated circuit device shown in FIG. 3. FIG. 7 is a layout showing the third embodiment of the present invention. A unit cell 51 is one unused for a circuit configuration of MTCMOS upon wire processing of MTCMOS. The unit cell 51 comprises two PMOS transistors 83 each comprised of an N well 89, P-type diffused layers 86, 87 and 88, and gate electrodes 84 and 85 all of which are formed on a substrate 82, and two NMOS transistors 95 each comprised of a P well 101, N-type diffused layers 98, 99 and 100, and gate electrodes 96 and 97 all of which are formed on the substrate 82. The gate electrode 84 and P-type diffused layer 86 of each PMOS transistor 83 are electrically connected to a virtual ground line 103 by contacts 92 and 93. The gate electrode 97 and N-type diffused layer 100 of each NMOS transistor 95 are electrically connected to a virtual power supply line 91 by contacts 104 and 105. Incidentally, the N well 89 is fixed to a power supply potential level and the P well 101 is fixed to a ground potential level, respectively.

Since the gate electrode 84 and P-type diffused layer 86 of the PMOS transistor 83 are electrically connected to the virtual ground line 103, gate capacitance having a MOS capacitor structure, which is formed between the gate electrode 84 and the N well 89, and PN-junction capacitance formed between the P-type diffused layer 86 and the N well 103 electrically connected to the ground potential, are respectively activated as de-coupling capacitance (corresponding to the capacitor 21). As a result, the value of a voltage applied to the virtual ground line is stabilized. Similarly, since the gate electrode 97 and N-type diffused layer 100 of the NMOS transistor 95 are electrically connected to the virtual power supplly line 91, gate capacitance formed between the gate electrode 97 and the P well 101 and PN-junction capacitance formed between the N-type diffused layer 100 and the P well 101 electrically connected to the power supply potential are respectively activated as de-coupling capacitance (corresponding to the capacitor 22). Thus, the value of a voltage applied to the virtual power supply line is stabilized. Owing to the provision of such capacitors 21 and 22, when switching is done between logic circuits provided within MTCMOS, the values of the voltages applied to the virtual power supply and ground lines can be restrained from varying and the delay time can be reduced.

According to the present invention, as has been described above in detail, since the layout of MTCMOS can be implemented by the gage array system, the manufacturing period can be shortened as compared with the conventional standard cell system. Further, according to the present invention, since the capacitors for the virtual power supply and ground lines are provided, the values of the voltages applied to the virtual power supply and ground lines can be restrained from varying and the delay time can be reduced upon switching between the logic circuits lying within MTCMOS.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit device, comprising:

a plurality of first unit cells each including a plurality of first MOS transistors, each of the first MOS transistors having a first threshold voltage;

a plurality of second unit cells each including a plurality of second MOS transistors, each of the second MOS transistors having a second threshold voltage;

a unit cell array comprised of said first and second unit cells laid in array form;

a power switch disposed around said unit cell array and comprised of a plurality of third MOS transistors, each of the third MOS transistors having the second threshold voltage; and a plurality of input/output circuits disposed around said unit cell array.

2. A semiconductor integrated circuit device according to claim 1, wherein said power switch is turned off during standby and turned on when taken active.

3. The semiconductor integrated circuit device according to claim 1, wherein parts of said power switch are disposed within said unit cell array.

4. A semiconductor integrated circuit device comprising:

a first power supply line supplied with a first power supply potential level;

a second power supply line supplied with a second power supply potential level;

a first virtual power supply line;

a second virtual power supply line;

a latch circuit connected between said first and second power supply lines;

a logic circuit connected between said first power supply line and said second virtual power supply line;

a first capacitor connected between said first power supply line and said second virtual power supply line; and a second capacitor connected between said second power supply line and said first virtual power supply line;

wherein said latch circuit, said logic circuit and said first and second capacitors are constructed by connecting MOS transistors placed within unit cells in array form.

5. The semiconductor integrated circuit device according to claim 4, wherein said first capacitor is comprised of a first MOS transistor, which has a control electrode connected to said second virtual power supply line, and first and second electrodes commonly connected to said first power supply line, formed in a first conduction-type region; and wherein said second capacitor is comprised of a second MOS transistor, which has a control electrode connected to said first virtual power supply line, first and second electrodes commonly connected to said second power supply line, formed in a second conduction-type region.

6. The semiconductor integrated circuit device according to claim 4, wherein said first capacitor is comprised of a first MOS transistor, which has a first electrode connected to said second virtual power supply line, and control and second electrodes commonly connected to said first power supply line, formed in a first conduction-type region; and wherein said second capacitor is comprised of a second MOS transistor, which has a first electrode connected to said first virtual power supply line, and control and second electrodes commonly connected to said second power supply line, formed in a second conduction-type region.

7. The semiconductor integrated circuit device according to claim 4, wherein said first capacitor is comprised of a first MOS transistor, which has control and first electrodes commonly connected to said second virtual power supply line, and a second electrode connected to said first power supply line, formed in a first conduction-type region; and wherein said second capacitor is comprised of a second MOS transistor, which has control and first electrodes commonly connected to said first virtual power supply line, and a second electrode connected to said second power supply line, formed in a second conduction-type region.

* * * * *